United States Patent [19]

Jansson et al.

[11] 4,151,518

[45] Apr. 24, 1979

[54] CONTROLLING ASYNCHRONOUS CONVERSION BETWEEN ANALOG AND DIGITAL PARAMETERS

[75] Inventors: Erik L. Jansson, Farsta; Tommy E. Svensson, Skärholmen, both of Sweden

[73] Assignee: Telefonaktiebolaget L M Ericsson, Stockholm, Sweden

[21] Appl. No.: 777,956

[22] Filed: Mar. 16, 1977

[30] Foreign Application Priority Data

Mar. 31, 1976 [SE] Sweden .................................. 7603843

[51] Int. Cl.² ............................................. H03K 13/02
[52] U.S. Cl. .......................... 340/347 C; 179/15 AV; 340/347 AD; 340/347 DA; 340/347 M
[58] Field of Search ....... 340/347 C, 347 M, 347 AD, 340/347 DA; 179/15 AV

[56] References Cited

U.S. PATENT DOCUMENTS

| | | | |
|---|---|---|---|
| 3,883,864 | 5/1975 | Thomas | 340/347 C X |
| 3,984,829 | 10/1976 | Zwack | 340/347 DA X |
| 3,993,992 | 11/1976 | Zwack | 340/347 C |

Primary Examiner—Thomas J. Sloyan

Attorney, Agent, or Firm—Hane, Roberts, Spiecens & Cohen

[57] ABSTRACT

A PCM codec for converting between PCM words and analog signals has at least one element which is used for both types of conversions even though the clock pulse frequencies of the incoming and outgoing PCM words are different; a timing unit for generating time intervals wherein a first and second number are needed at the very most to carry out the respective conversion operations, the shorter of the period lengths determined by the two clock pulse frequencies includes at least the sum of the two numbers of time intervals; and a control unit for receiving the clock pulses in order to indicate the respective conversion type and for generating conversion type signals by means of which each of the time intervals is associated with one of the two conversion types. In order to control states where a type signal is generated delayed with respect to a notification pulse, the codec includes information memories to store the influenced information. And in order to control states where the control unit interrupts the present conversion operation of one type due to the priority of the other type, the codec includes a result memory to store such intermediate results which make it possible to continue the interrupted operation after the termination of the priority operation.

22 Claims, 5 Drawing Figures

CONTROLLING ASYNCHRONOUS CONVERSION BETWEEN ANALOG AND DIGITAL PARAMETERS

The present invention relates to a method for controlling a PCM-codec which converts incoming analog signals to PCM words transmitted at a first clock frequency and which converts at a second clock frequency incoming PCM words to outgoing analog signal samples wherein at least one of the two conversion types is achieved by means of an approximation operation and the clock frequencies have approximately equal period lengths. The invention also relates to apparatus for performing the method.

Such converting methods are known and in particular the required A to D (analog to digital) and D to A (digital to analog) converters respectively are described in articles entitled "Conversion A/D & D/A" reported during "Journées d'electronique 1973" and published by "Ecole polytechnique federale de Lausanne". These articles also discussed linear and logarithmic coding and decoding curves respectively for establishing coding relations between the analog signal samples and the PCM words.

There are direct conversion methods according to which the incoming information is converted owing to the characteristic curve directly to the outgoing information, and there are approximation methods according to which the characteristic curve is scanned by means of an approximation program until a curve interval is found whose analog signal amplitude and PCM word respectively agree with the incoming information. Constructively direct D to A conversions are achieved easier than direct A to D conversions. A simple and quick reacting direct D to A converter is described in the Swedish Patent Application No. 7510801-9. The above cited articles also describe A to D approximation methods wherein each approximation step includes a direct D to A conversion. One of the methods is called successive approximation which will hereinafter be dealt with in detail.

The above mentioned summary of prevalent conversion methods makes clear that there are PCM codec types which include apparatus which is used both for A to D and for D to A conversions. For example both the conversion types (A to D and D to A) use an approximation logic network in order to generate coding characteristics, or a D to A converter working according to the direct method.

An object of the present invention is to control such a PCM codec so that there is no redundant equipment without requiring synchronous operation conditions. A synchronously controlled multi-channel codec described in German published application No. 2432976 has a common clock signal generator for controlling in parallel a number of binary counters each associated with an A to D and D to A converter for each of the channels, one A to D and one D to A conversion operation being executed during each time slot in parallel, i.e., with separate equipments. In German published application No. 2333299 there is shown a synchronously controlled one-channel codec having a common function generator for scanning a conversion characteristic curve which is used in parallel for A to D and D to A conversion. A synchronously controlled PCM codec described in German published application 2518277 comprises a common D to A converter which in alternating order is used for A to D and D to A conversions.

None of these known codec apparatuses would, however, work satisfactory during so called plesiochronous operation conditions where the clock frequencies of the two converting types have the same nominal value, around which are allowed constant or varying deviations within determined limits. Independent of which of the clock frequencies periodically is higher or lower than the other, the present invention contemplates that one conversion type will be carried out at a time and never in parallel with the other conversion type. Thus in designing a suitable codec type which utilizes the same kind of equipment for A to D and D to A conversion no redundant equipment is needed because the same equipment which at a time takes part in the first type of conversion is used, in spite of plesiochronous conditions, at another time in the second type of conversion.

The present invention the characteristics of which appear from the claims and which achieves such advantageous qualifications without the disadvantageous side effects such as loss of information will now be described by means of the accompanying drawing.

Figure 1:
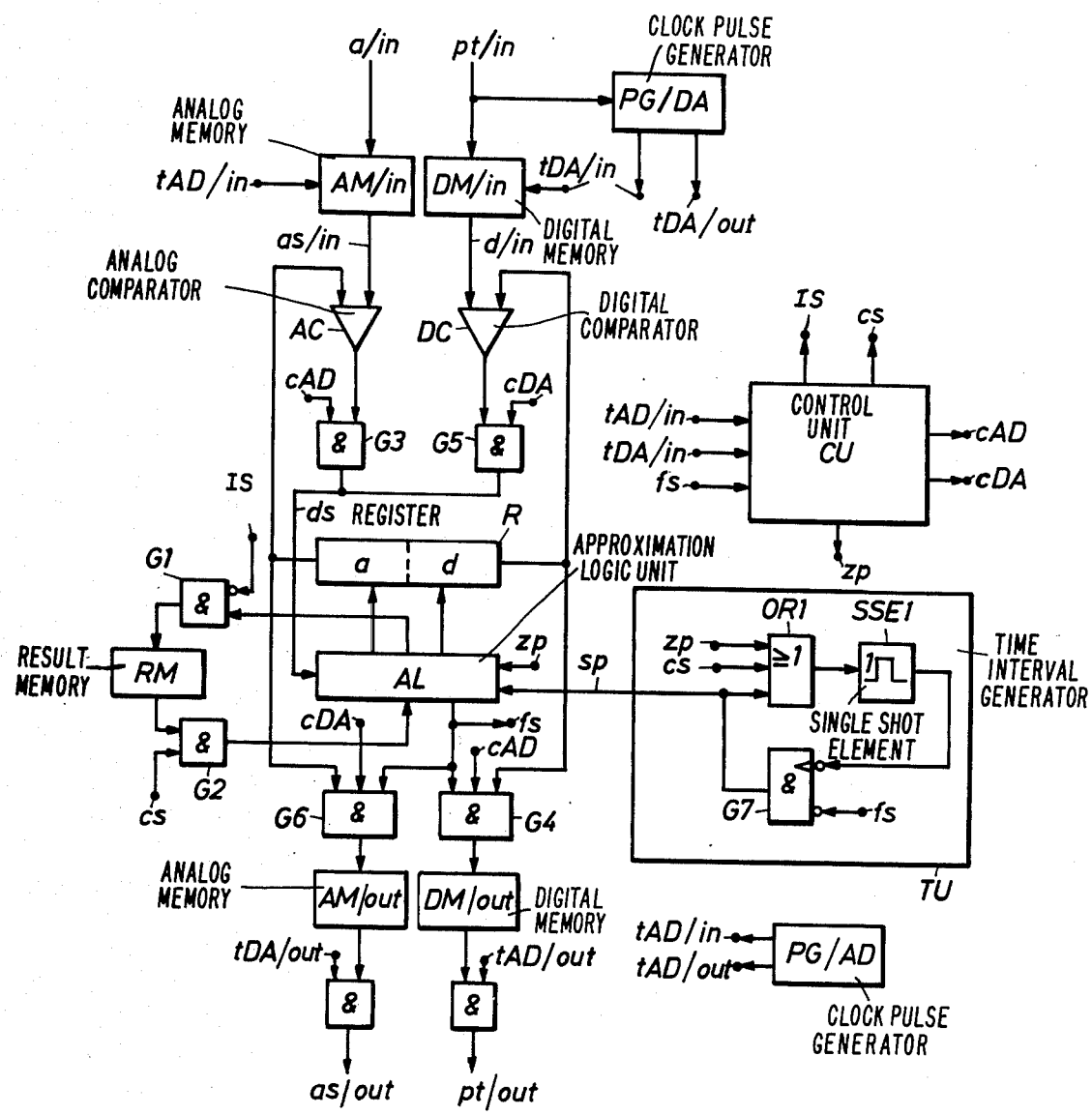
FIG. 1 shows a block diagram of an apparatus for carrying out the invention.

FIG. 1 shows an analog input memory AM/in receiving incoming analog signals a/in in order to take analog signal samples as/in. The sampings are periodically performed under control of timing or clock pulses tAD intended for AD conversions. The pulses are obtained from a first clock pulse generator PG/AD which generates pulses at the above-mentioned first clock frequency. The analog signal samples are transferred from the input memory AM/in to a first input of an analog comparator AC. An approximation logic unit AL which is zero set by means of a zero pulse zp is stepped by means of stepping pulses sp, in order to generate, during a time interval between two successive stepping pulses, an analog signal amplitude a and its, according to a conversion curve, associated digital word d. This stepping principle is indicated by means of a register R from which the amplitude obtained during a time interval is transferred to a second input of the analog comparator AC which generates a difference signal ds. The approximation logic unit AL continues the approximation process or transmits a final signal fs. In an A to D conversion the final signal activates the transfer of the digital word d registered in the register R to a digital output memory DM/out from which a PCM pulse train pt/out is transmitted by means of timing pulses tAD/out generated by first clock pulse generator PG/AD. If the PCM words are transmitted serially, the frequency which determines the output timing pulses tAD/out will be a multiple of the frequency which determines the input clock or timing pulses tAD/in. If the PCM words are transmitted in parallel form, the input and output timing pulses are synchronous except for a possible but constant phase displacement between the pulses which is inserted for adapting the output time to the operation time needed for the conversion process.

According to FIG. 1 each of the two conversion types are carried out in a completely corresponding way. A second clock pulse generator PG/DA generates, in known manner from an incoming PCM pulse train pt/in, for D to A conversions the required timing or clock pulses tDA/in, by means of which a digital input memory DM/in is controlled in order to buffer store incoming PCM words d/in. The digital word d obtained during an approximation step and registered in said register R is compared with the buffer stored PCM word by digital comparator DC whose output emits the difference signal ds which controls the approximation logic unit AL. In a D to A conversion a final signal activates the transfer of the registered analog-signal amplitude a to an analog output memory AM/out. The memory emits an outgoing analog signal sample as/out via a gate in response to an output timing pulse tDA/out generated by the second clock pulse generator PG/DA. This timing disregarded a possible phase displacement and is synchronous in comparison with the input timing pulses tDA/in.

The output memories DM/out and AM/out would be unnecessary, if the conversion operations are such and are controlled in such a manner that said final signals fs always occur synchronously with the incoming timing pulses of the respective conversion type.

The general codec equipment shown in FIG. 1 is provided with a result memory RM whose inputs and outputs are connected to the approximation logic unit AL which is assumed to generate, during each approximation time interval, such intermediate results which make it possible that after a pause to resume the approximation process without repeating previously performed steps. The pause begins when an interruption signal IS interrupts the transmission of the intermediate results from the approximation logic unit via an AND-gate G1 to the result memory. The pause ends when a continuing signal cs opens an AND-gate G2 for transfer of the intermediate results from the result memory RM to the approximation logic unit AL which during the pause has been idle of carrying out another approximation operation.

The codec equipment according to FIG. 1 is provided with gate devices G3, G4 and G5, G6, which are controlled by means of conversion type signals cAD and cDA so that the approximation logic unit AL and the register R take part in the A to D and D to A conversion operations, respectively. Dependent on the conversion methods, each conversion type needs maximally a number of time intervals. However in spite of plesiochronous conditions it is possible to use the same approximation logic unit AL and register R for both operation types, if the allowed tolerance limits of the clock frequencies, time intervals and maximal numbers of time intervals are so related to each other that the time required for at least one conversion operation of each type is less than the time between two successive sampling or timing pulses intended for one of the operation types.

The approximation logic unit AL according to FIG. 1 obtains the stepping pulses sp from an AND-gate G7 of a time interval generator TU. The means for obtaining two-successive-stepping-pulses-limited time intervals is achieved by a single-shot element SSE1. The input of element SSE1 is activated via an OR-gate OR1 by either a zero pulse zp, or a continuing signal cs, or by pulse trailing edges generated of the single-shot element via AND-gate G7 on the assumption that the approximation logic unit does not transmit the final signal fs. According to the shown common principle each zero pulse zp or continuing signal cs starts the generation of a time interval when a possible present time interval is ended. Obviously the time interval generator TU can also be constituted of a step pulse generator started and stopped in a corresponding way. Hereinafter in connection with FIG. 5 there will be described how such stepping pulses and time intervals are achieved by means of a timing frequency multiple which is generated by one of the clock pulse generators.

Figure 2:
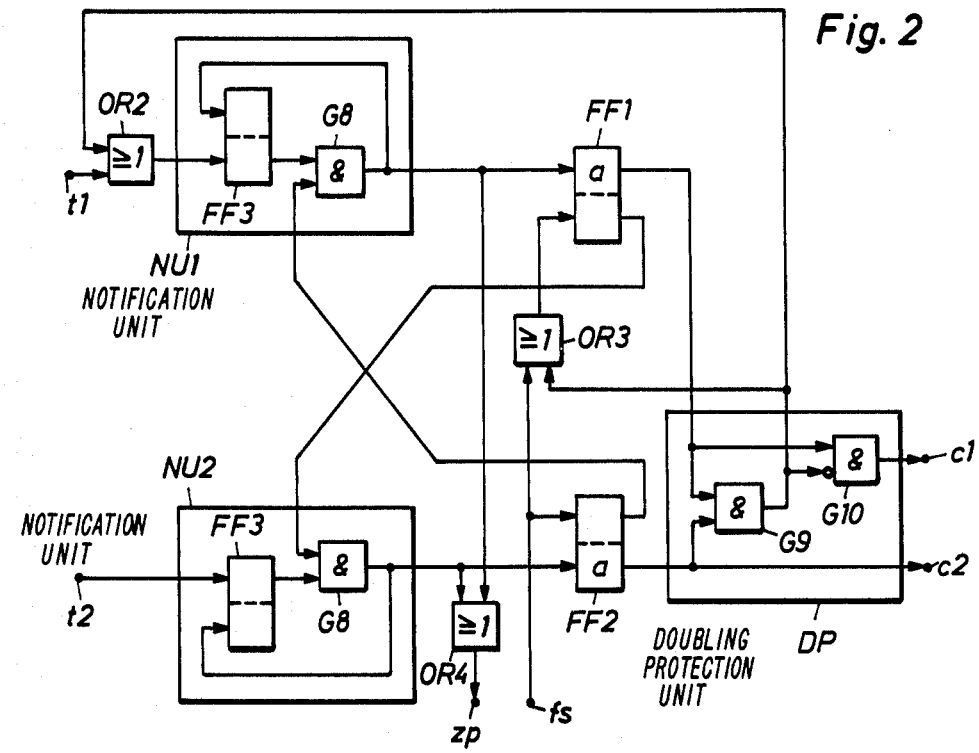
FIGS. 2 to 4 show different embodiments of a control unit for the apparatus of FIG. 1.
Figure 3:
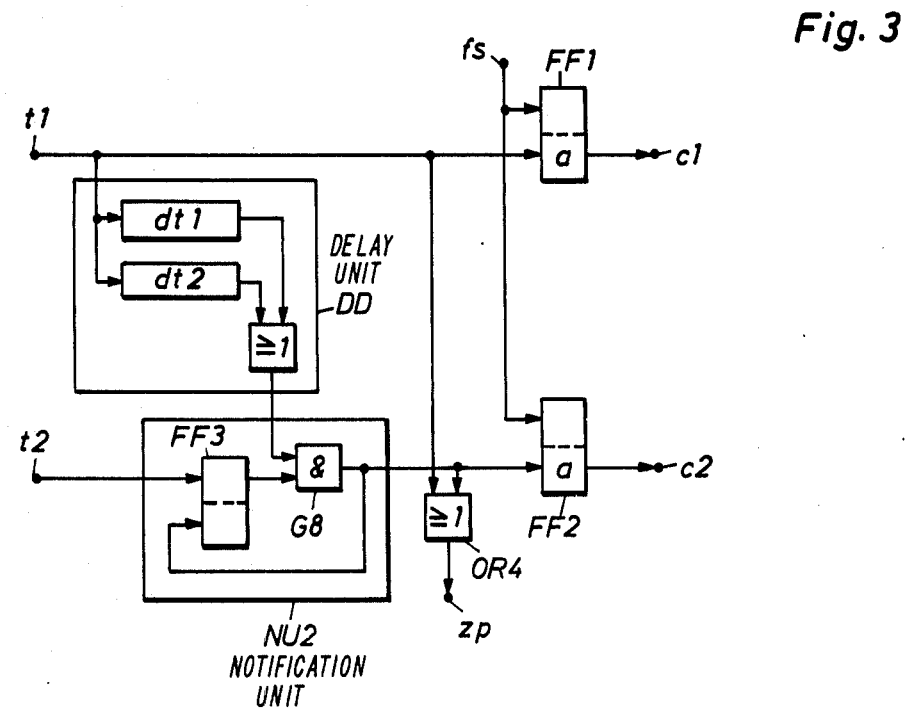
Figure 4:
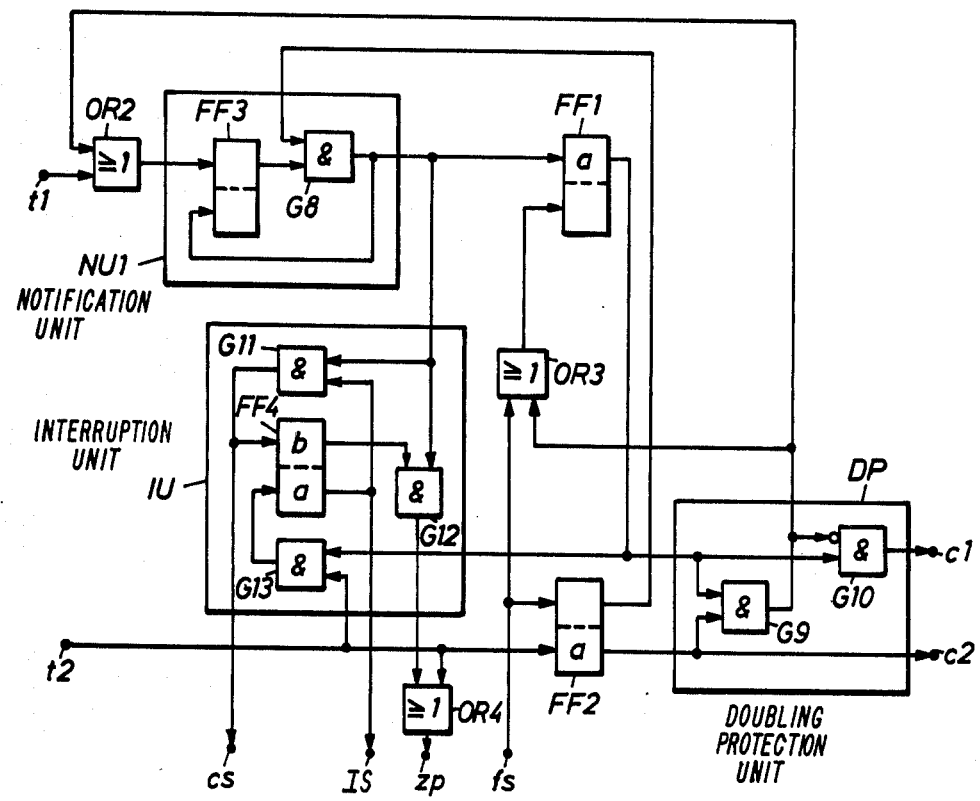

The codec equipment according to FIG. 1 is controlled by means of a control unit CU which receives the pulses tAD/in and tDA/in coming from the clock pulse generators PG/AD and PG/DA and the final signals fs coming from the approximation logic AL unit. The unit generates the conversion type signals cAD and cDA, the zero pulses zp, and the interruption and continuing signals IS and cs. FIGS. 2 to 4 show three embodiments control unit CU which receive timing pulses t1 and t2 generated by the clock pulse generators and transmit conversion type signals c1 and c2. The designations 1 and 2 are used in order to distinguish between the two conversion types. If for example the designation 1 is chosen for A to D conversion operations, the timing pulses t1 are the above-mentioned timing pulses tAD/in, and the conversion type signals c1 are the above-mentioned signals cAD so that the approximation logic unit AL takes part in an A to D conversion operation. Similarly the designation 2 would be associated with D to A conversions.

FIG. 2 shows a first embodiment of the control unit CU which comprises two notification units NU1 and NU2 whose outputs are connected to the respective conversion type flip-flops FF1 and FF2. The notification units NU1 and NU2 each comprise an AND-gate G8 and a flip-flop FF3, the one input of which receives the timing pulses and the second input of which is connected to the output of the AND-gate G8 which constitutes the output of the notification unit. AND-gate G8 is arranged for preventing the conversion type flip-flop belonging to the same conversion type from being put in its one stable state a by means of a respective timing pulse if the flip-flop associated with the second conversion type is already in the corresponding state a. The final signal fs resets an a-set type flip-flop. If the timing pulses t1 and t2 coincide and if therefore type flip-flops FF1 and FF2 are set to a-state simultaneously, a doubling protection unit DP prevents a coincidence of the conversion type signals c1 and c2. The doubling protection unit DP comprises AND-gates G9 and G10 which, in the coincidence case, stops the type signal c1, notifies via an OR-gate OR2, again an operation of the type 1 and resets, via an OR-gate OR3, the type flip-flop FF1. This first embodiment forces varying waiting times before a conversion operation is allowed to start. Therefore, the zero pulses zp transmitted via an OR-gate OR4 and consequently also the final signals fs generated by the approximation logic unit are not in synchronism with the respective timing pulses. The memories AM/in, DM/in, AM/out and DM/out in order to buffer store the incoming and outgoing information are consequently indispensable codec parts. A result memory, however, is not needed, because this first embodiment generates no interruption and continuing signals.

FIG. 3 shows a second embodiment of the control unit which in correspondence with the first embodiment comprises two conversion type flip-flops FF1 and FF2, a notification unit NU2 and an OR-gate OR4. In this second embodiment each timing pulse t1 always immediately releases a zero pulse zp and a conversion type signal c1. If it is assumed that the conversion method determined by means of the designation 1 consists of a constant number of time intervals, as for example the above mentioned successive approximation method, synchronism is obtained between the timing pulses t1 and respective final signals fs. Thus it follows that the output memory for buffer storing respective outgoing information is dispensible. In a respective direct conversion method the input memory for buffer storing respective incoming information would, furthermore, be unnecessary.

The second embodiment also includes a delay device DD connected to the notification unit NU2. The delay unit DD emits for each timing pulse t1 two pulses which, in relation to this timing pulse, are delayed in such a way that the first pulse delayed by a time dt1 occurs when the type signal c1 absolutely has ceased, and that the other pulse delayed by a time dt2 occurs when a type signal c2 generated in response to the said first delayed pulse absolutely has ceased. The type signals c2 and associated zero signals zp arise if a conversion of type 2 is notified by means of a timing pulse t2. The time interval generator TU is in this connection so dimensioned that each period determined by the timing pulses t1 embraces as many time intervals which at the most are needed for one type 1 operation and two operations type 2. If the timing pulses t2 have a higher frequency than the timing pulses t1, furthermore, the above-mentioned pre-requisite has to be fulfilled, i.e., that an operation of each type is embraced in a period determined by the timing pulses t2. In spite of plesiochronous conditions, the type signals c1 and c2 can for this second embodiment never coincide. Therefore, the doubling protection unit described in connection with FIG. 2 is unnecessary. The conversion operations of type 2 are exposed to varying waiting times, consequently, the controlled codec equipment has to be provided with respective buffer memories.

FIG. 4 shows a third embodiment of the control unit which like the first embodiment comprises two conversion type flip-flops FF1 and FF2, a notification unit NU1, a doubling protection unit DP and OR-gates OR2, OR3 and OR4. A present operation of the type 2 prevents the type flip-flop FF1 from being put in the stable state a, and the doubling protection unit prevents both type flip-flops from being put simultaneously in the stable state a. In this third embodiment each timing pulse t2 always immediately releases a zero pulse zp and a conversion type signal c2. The AND-gate G9 of the doubling protection unit DP achieves an interruption of an already begun operation of the type 1 because the type flip-flop FF1 is reset via the OR-gate OR3 and a continuation of the interrupted operation is notified via the OR-gate OR2. An interruption unit IU for generating the above-mentioned interruption and continuing signals IS and cs comprises a reversing switch which, in FIG. 4, is constituted of two AND-gates G11 and G12. The switch has its input connected to the output of the notification unit NU1 and its outputs transmit a continuing signal cs and a zero pulse zp respectively in dependence of the state a and b respectively of an interruption flip-flop FF4. The flip-flop FF4 generates an interruption signal IS, when it is set to the a-state by means of an AND-gate G13 which is activated by a timing pulse t2 occurring during a present operation of type 1. The continuing signal cs sets the interruption flip-flop to the b-state.

Figure 5:
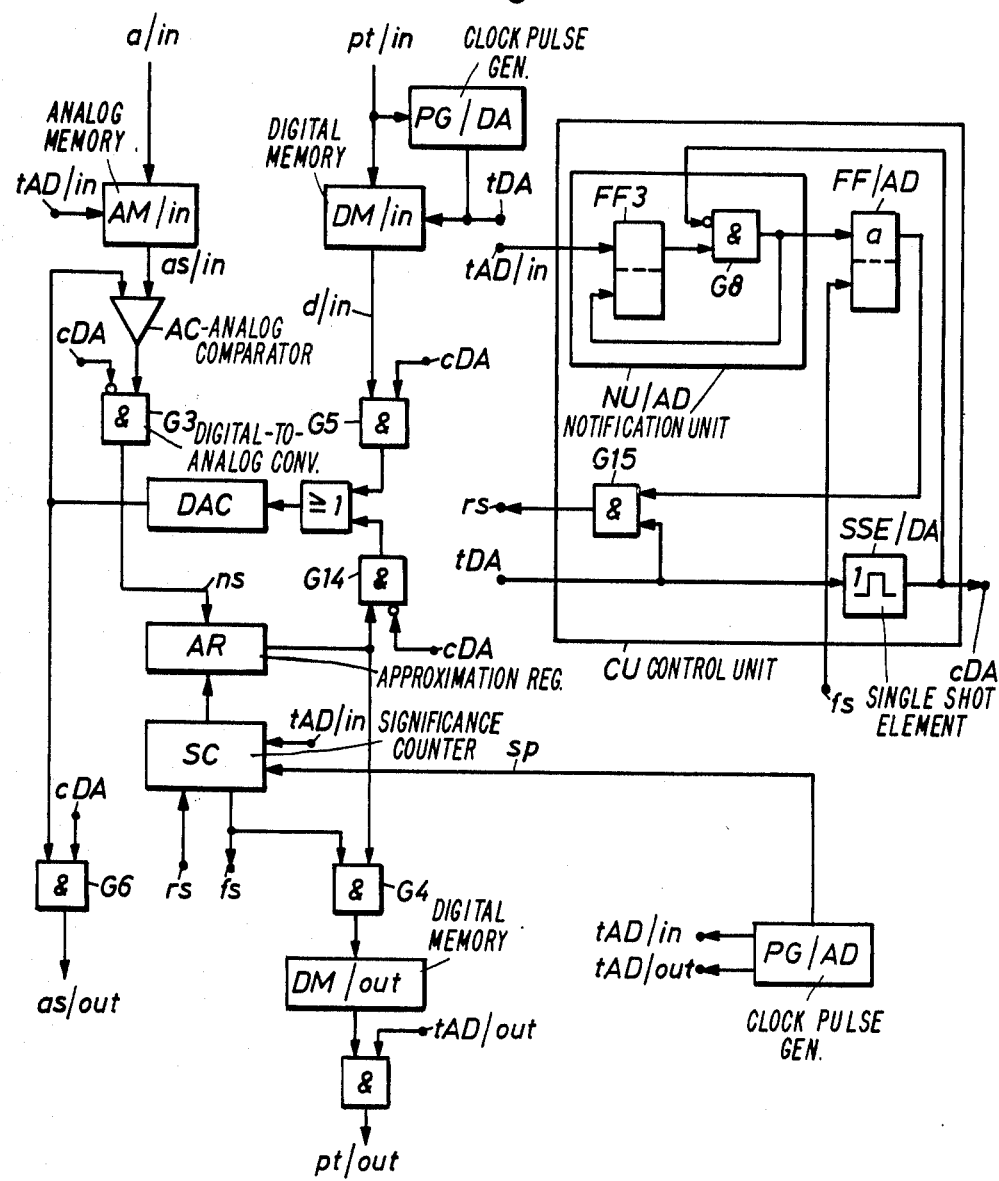
FIG. 5 shows a control unit which controls a PCM codec provided with a common direct D to A converter.

FIG. 5 shows a PCM codec which comprises a direct converting D to A converter DAC for, on the one hand, converting the PCM words d/in incoming via the activated AND-gate G5 to outgoing analog samples as/out via the activated AND-gate G6, and for, on the other hand, participating in a so called successive approximation process. For this purpose, the AND-gates G3, G4 and G14 are activated and an analog comparator AC is used for comparing the analog signal sample as/in from an input memory AM/in with an approximation amplitude and for generating a nullification signal ns if the sample is less than the approximation amplitude. Further an approximation register AR has bit positions which are step-by-step set to "1" by means of a significance counter SC but are reset to "0" during a respective step if a D to A conversion of the contents of the approximation register causes a nullification signal ns. It should be noted that each A to D time section in the successive approximation includes a put-to "1" phase, a D to A conversion phase, a comparison phase and a proof phase, while the entire D to A conversion operation consists only of one D to A conversion phase which requires only a part of a single A to D time interval.

The control unit CU shown in FIG. 5 is a modification of the third embodiment described in connection with FIG. 4, the D to A conversion having priority in relation to the A to D conversion and care having been taken to the time relations between the phases. Each timing pulse tAD/in obtained from the clock pulse generator PG/A to D and intended for notifying an AD conversion at the notification unit NU/AD, connects the most significant bit position of the approximation register AR to the significance counter SC. Step pulses sp achieve successive significance value reductions. When the processing of the lowest significant bit position is finished, the significance counter SC transmits a final signal fs for controlling the transfer of the PCM word outgoing to the digital output memory DM/out and for resetting the conversion type flip-flop FF/AD. The D to A conversion operation needs neither a zero pulse sp, step pulses nor a final signal, fs. Furthermore its type flip-flop for generating the type signal cDA and controlling of said notification unit NU/AD is replaced by a D to A single-shot element SSE/DA which generates a "1" state during the direct D to A conversion phase. A doubling protection means is not needed and the interruption unit consists of an AND gate G15 which in the doubling and interruption case generates a repetition signal rs which replaces the above-mentioned interruption and continuing signals. While the significance counter SC and the approximation register AR are used only for the AD conversion operations no result memory is needed. When the significance counter SC receives the repetition signal rs the next following step pulse entails no significant value reduction. In this way the preferential D to A conversion takes over an already begun A to D conversion time interval and the interrupted approximation step is repeated in the following time interval.

According to FIG. 5 the step pulses sp are obtained by means of a clock frequency multiple which is generated by the clock pulse generator PG/AD so that each timing pulse tAD/in coincides with a step pulse.

If the codec equipment shown in FIG. 5 is to be controlled by means of the second embodiment second control unit, the A to D conversion type is allotted to the type designation 1 and the clock pulse generator PG/AD is again used for generating the timing pulses t1 coinciding with a step pulse. The delay device DD is constituted suitably of a counter started by means of the timing pulses t1 and stepped by means of the step pulses sp. The counter is provided with two outputs, the activations of which achieve the delay times dt1 and dt2. The designation 2 in FIG. 3 is allotted the D to A conversions which, without zero pulses and final signals, are controlled by means of a D to A single-shot element which replaces the conversion type flip-flop FF2.

We claim:

1. In a codec having a first input means for receiving first units of information represented by analog signals and being periodically sampled by a first clock signal having a first frequency and a first period, a second input means for receiving second units of information represented by digital PCM-words and being periodically sampled by a second clock signal having a second frequency and a second period, the first and second input clock signals having approximately equal periods but being in a plesiochronous relationship, an approximation means for receiving samples of both types of information, and for generating functionally interrelated digital PCM-words and analog signal amplitudes, and being periodically stepped by a third clock signal having a third frequency and a third period, there being a first finite number of steps through which the approximation means can be stepped for generating the digital PCM-word which is related to the received analog signal sample, and a second finite number of steps through which the approximation means can be stepped for generating the analog signal amplitude which is related to the received digital PCM-word sample, a first output means adapted to transmit analog signals, and a second output means adapted to transmit digital PCM-words, the method of controlling the codec to perform conversions of a first type resulting in that an analog signal is converted to a digital PCM-word and also conversions of a second type resulting in that a digital PCM-word is converted to an analog signal with the approximation means at least partly being common to both conversion types, said method comprising the steps of
    selecting the third periods such that the time required to perform the first number of finite steps as well as the second number of finite steps is shorter than one of said first and second periods,
    initiating conversions of the first type in response to said first clock signals sampling the first information received by the first input means,
    initiating conversions of the second type in response to said second clock signals sampling the second information received by the second input means,
    stepping the approximation means with said third clock signals in response to received first information samples, in order to perform conversions of the first type,
    stepping the approximation means with said third clock signals in response to received second information samples, in order to perform conversions of the second type,
    transferring the results of such conversions of the first type to the second output means,
    transferring the results of such conversions of the second type to the first output means, and
    insuring that only one of said conversions can occur at any one time.

2. The method of claim 1 wherein the third periods are selected such that the time required to perform the first number of finite steps as well as the second number of finite steps is no longer than the shorter of said first and second periods and said insuring step comprises temporarily storing in the first input means received first information samples,
    temporarily storing in the second input means received second information samples,
    temporarily storing the results of conversions of the first type in the second output means,
    temporarily storing the results of conversions of the second type in the first output means,
    delaying the initiation of one of the conversions if an other of the conversions is in process until the completion of the other of the conversions, and
    selecting a particular one of the two conversion types to have a conversion of said particular type performed if conversions of both types are to be initiated simultaneously in response to the simultaneous samplings by the first and second clock signals.

3. The method of claim 1 wherein said selecting step further comprises
    selecting the third periods such that the time required to perform once one of said finite numbers of steps which is associated with one of said conversion types as well as to perform twice the other finite number of steps which is associated with the other conversion type is no longer than that one of said first and second periods which refers to said one conversion type,
    and wherein said insuring step comprises
    generating first, second and third initiating signals by means of at least two selected delayings in response to the clock signals which refer to said one conversion type, said delayings being such that said one finite number of steps can be performed between the first and second initiating signals, and that the other finite number of steps can be performed between the second and third as well as between the third and first initiating signals,
    initiating conversions of said one type in response to said first initiating signals,
    temporarily storing, with reference to said other conversion type, received information in the associated input means,
    initiating conversions of said other type in response to the clock signals associated with said other conversion type and to one of the second and third initiating signals, and
    temporarily storing, with reference to said conversion type, the conversion results in the associated output means.

4. The method of claim 1 wherein the third periods are selected such that the time required to perform the first number of finite steps as well as the second number of finite steps is no longer than the shorter of said first and second periods and said insuring step comprises selecting a particular one of the two conversion types to have a conversion of said particular type performed if conversions of both types are to be initiated simultaneously in response to the simultaneous samplings by said first and second clock signals, and to have a conversion of said particular type performed independent of a conversion of the other type which is in process when said particular conversion is initiated, temporarily storing, with reference to said other conversion type, received information in the associated input means, interrupting a conversion of the other type which is in progress when said particular conversion is initiated, completing said interrupted other conversion when said particular conversion ends, and temporarily storing, with reference to said other conversion type, the conversion results in the associated output means.

5. The method of claim 4 wherein said insuring step further comprises starting a conversion of said particular type at the end of the third period in progress when said interruption occurred.

6. The method of claim 4 wherein said insuring step further comprises taking over by a conversion of said particular type, in connection with the interruption, the third period used for a conversion of the other type.

7. In a codec having a first input means for receiving analog signals, and being periodically sampled by a first clock signal having a first frequency and a first period, a second input means for receiving digital PCM-words and being periodically sampled by a second clock signal having a second frequency and a second period, the first and second clock signals having approximately equal periods but being in a plesiochronous relationship, a first output means adapted to transmit analog signals, a second output means adapted to transmit digital PCM-words, a common periodically stepped approximation logic and comparator means which for each step generates a digital PCM-word at a digital output and an analog signal amplitude at an analog output functionally related to the digital PCM-word, there being a first finite number of steps through which the approximation logic and comparator means can be stepped for an analog signal to digital PCM-word conversion and a second finite number of steps through which the approximation logic and comparator means can be stepped for a digital PCM-word to analog signal conversion, the method of controlling the codec to perform a first conversion of an analog signal to a digital PCM-word and also a second conversion of a digital PCM-word to an analog signal with the common periodically stepped approximation logic and comparator means, said method comprising the steps of selecting the period of each step of the approximation logic and comparator means such that the time required to perform the first number of finite steps as well as the second number of finite steps is no longer than the shorter of said first and second periods whereby a first and a second coversion can be performed in a time interval which is not greater than said shorter period, storing in the first input means received analog signals, storing in the second input means received digital PCM-words, initiating a first conversion by the approximation logic and comparator means in response to a first clock signal sampling the analog signal stored in the first input means, storing the results of such first conversion in the second output means, initiating a first conversion by the approximation logic and comparator means in response to a second clock signal sampling the digital PCM-word stored in the second input means, storing the results of such second conversion in the second output means, and delaying the initiation of one of the conversions if the other of the conversions is being performed until the completion of the other of the conversions.

8. The method of claim 7 further comprising the step of selecting a particular one of said conversions to be performed if both conversions are to be initiated simultaneously in response to the simultaneous samplings by the first and second clock signals.

9. In a codec having a first input means for receiving analog signal values and being periodically sampled by a first clock signal having a first frequency and a first period, a second input means for receiving digital PCM-word values and being periodically sampled by a second clock signal having a second frequency and a second period, the first and second clock signals having approximately equal periods, but being in a plesiochronous relationship, a first output means adapted to transmit analog signal values, a second output means adapted to transmit digital PCM-word values, a common periodically stepped approximation logic and comparator means which for each step generates a digital PCM-word value at a digital output and an analog signal value at an analog output functionally related to the digital PCM-word value, there being a first finite number of steps through which the approximation logic and comparator means can be stepped for an analog signal value to digital PCM-word value conversion and second finite number of steps through which the approximation logic and comparator means can be stepped for a digital PCM-word value to analog signal value conversion, the method of controlling the codec to perform a first conversion of an analog signal value to a digital PCM-word value and also a second conversion of a digital PCM-word value to an analog signal value with the common periodically stepped approximation logic and comparator means, said method comprising the steps of selecting the periods of the steps of the approximation logic and comparator means such that the time required to perform one of said finite number of steps as well as to perform the other finite number of steps twice is no longer than one of said first and second periods whereby at least a first and a second conversion can be performed in said shorter period, immediately initiating one of the conversions on one value received by one of the input means by the approximation logic and comparator means in response to one of the clock signals sampling the one value received by said one of the input means, and transferring via the associated one of the output means the results of said one conversion, temporarily storing in the other input means the other value received thereby, initiating, in response to the sampling of the other value being stored in said other input means, but after said one conversion has been completed, the other of the conversions by the approximation logic and comparator means on the other value stored in said other input means, and storing in the other output means the results of said other conversion.

10. In a condec having a first input means for receiving analog signal values and being periodically sampled by a first clock signal having a first frequency and a first period, a second input means for receiving digital PCM-word values and being periodically sampled by a second clock signal having a second frequency and a second period, the first and second clock signals having approximately equal periods but being in a plesiochronous relationship, a first output means adapted to transmit analog signal values, a second output means adapted to transmit digital PCM-word values, a common periodically stepped approximation logic and comparator means which for each step generates a digital PCM-word value at a digital output and an analog signal value at an analog output functionally related to the digital PCM word value, there being a first finite number of steps through which the approximation logic and comparator means can be stepped for an analog signal value to digital PCM-word value conversion and second finite number of steps through which the approximation logic and comparator means can be stepped for a digital PCM-word value to analog signal value conversion, the method of controlling the codec to perform a first conversion of an analog signal value to a digital PCM-word value and also a second conversion of a digital PCM-word value to an analog signal value with the common periodically stepped approximation logic and comparator means, said method comprising the steps of selecting the periods of the steps of the approximation logic and comparator means such that the time required to perform one of said finite number of steps as well as to perform the other finite number of steps is no longer than the shorter of said first and second periods whereby at least a first and a second conversion can be performed in said shorter period, immediately initiating one of the conversions on one value received at one of the input means by the approximation logic and comparator means in response to one of the clock signals sampling the one value received by said one of the input means, and transferring via the associated one of the output means the results of said one conversion, temporarily storing in the other input means the other value received thereby, initiating, in response to the sampling of the other value being stored in the other input means unless said one conversion is being performed, the other conversion on the other value stored in the other input means, if said one conversion is being performed then delaying the initiation of said other conversion until said one conversion is completed; and the steps of interrupting said other conversion if said one conversion is initiated, storing the intermediate results of the interrupted other conversion, and completing said interrupted other conversion when said one conversion ends.

11. In a codec having a first input means for receiving incoming analog signals and being periodically sampled by a first input clock signal having a first frequency and a first period, a second input means for receiving incoming digital PCM-words and being periodically sampled by a second input clock signal having a second frequency and a second period, the first and second input clock signals having approximately equal periods, but being in a plesiochronous relationship, a first output means adapted to transmit analog signals, a second output means adapted to transmit digital PCM-words, a common periodically stepped approximation logic and comparator means which for each step generates a digital PCM-word at a digital output and an analog signal amplitude at an analog output functionally related to the digital PCM-word, there being a first finite number of steps through which the approximation logic and comparator means can be stepped for an analog signal to digital PCM-word conversion and second finite number of steps through which the approximation logic and comparator means can be stepped for a digital PCM-word to analog signal conversion, apparatus for controlling the codec to perform a first conversion of an analog signal to a digital PCM-word and also a second conversion of a digital PCM-word to an analog signal with the common periodically stepped approximation logic and comparator means, said apparatus comprising: a source of the first input clock signals and first output clock signals in synchronism therewith; a source of the second input clock signals and second output clock signals in synchronism therewith; a first analog signal memory means in the first input means, said first analog signal memory means having an input for receiving analog signals, a control input for receiving the first input clock signals and an output for transmitting an analog signal amplitude resulting from the sampling of the incoming analog signal by a first clock signal; a second analog signal memory means in the first output means, said second analog memory means having an input for receiving an outgoing analog signal, a control input for receiving the first output clock signals, and an output for transmitting an outgoing analog signal received at its input under control of a first output clock signal; a first digital PCM-word memory means in the second input means, said first digital PCM-word memory means having an input for receiving the incoming digital PCM-words a control input for receiving the second input clock signals and an output for transmitting the digital PCM-word being received during the occurrence of a second input clock signal; a second digital PCM-word memory means in the second output means, said second digital memory means having an input for receiving an outgoing digital PCM-word, a control input for receiving the second output clock signals and an output for transmitting an outgoing digital PCM-word received at its input under control of a second output clock signal; a timing unit having a control input and means for generating a first plurality or a second plurality of pulses for stepping the approximation logic and comparator means in response to the receipt of an initiate control pulse at the control input, the number of stepping pulses in said first and second pluralities being equal to the first and second finite numbers, the period of said stepping pulses being chosen such that the time required to generate sequentially said first and second pluralities is less than the period between the shorter of the periods of the first and second input clock pulses; controlled gating means associated with said approximation logic and comparator means for establishing connections to control the type of conversion to be performed, said controlled gating means in response to a first control signal permitting the conversion of an analog signal stored in said first analog signal memory means to a digital PCM-word which is then stored in the second digital PCM-word memory means, and in response to a second control signal permitting the conversion of the digit PCM-word stored in the first digital PCM-word memory means to an analog signal which is to be stored in the second analog signal memory means; and a control means receiving the first input clock signals for generating the first control signals and the initiate control pulses and receiving the second input clock signals for generating the second control signals and the initiate control pulses, said control means including means for insuring that only one of the first and second control signals is generated at any one time by delaying, during the generation of one of said control signals, the other control signal until the end of said one control signal even if the associated input clock signal is received.

12. The apparatus of claim 11 wherein said control means comprises a first and second notification means for registering the receipt of the first and second incoming clock signals respectively, first and second bistable means respectively settable to a first stable state by said first and second notification means for generating said first and second control signals respectively, means for setting each of said bistable means to a second stable state at the end of a conversion operation, and means for preventing one of said notification means from setting its associated bistable means to the first stable state while the other bistable means is in said first stable state.

13. The apparatus of claim 12 further comprising, in said control means, means for setting one of said bistable means to the second stable state if both of said bistable means were simultaneously set to the first stable state.

14. In a codec having a first input means for receiving incoming analog signal values and being periodically sampled by a first input clock signal having a first frequency and a first period, a second input means for receiving incoming digital PCM-word values and being periodically sampled by a second input clock signal having a second frequency and a second period, the first and second clock signals having approximately equal periods but being in a plesiochronous relationship, a first output means adapted to transmit analog signal values, a second output means adapted to transmit digital PCM-word values, a common periodically stepped approximation logic and comparator means which for each step generates a digital PCM-word value at a digital output and an analog signal value at an analog output functionally related to the digital PCM-word value, there being a first finite number of steps through which the approximation logic and comparator means can be stepped for an analog signal to digital PCM-word conversion and second finite number of steps through which the approximation logic and comparator means can be stepped for a digital PCM-word to analog signal conversion, apparatus for controlling the condec to perform a first conversion of an analog signal value to a digital PCM-word value and also a second conversion of a digital PCM-word value to an analog signal value with the common periodically stepped approximation logic and comparator means, said apparatus comprising: a source of the first input clock signals and first output clock signals in synchronism therewith; a source of the second input clock signals and second output clock signals in synchronism therewith; a first memory means in one of the input means, said first memory means having an input for receiving one of the incoming values, a control input for receiving one of the input clock signals and an output for transmitting a value resulting from the sampling of the incoming value by said one clock signal; a second memory means in one of the output means, said second memory means having an input for receiving an outgoing value, a control input for receiving one of the output clock signals, and an output for transmitting the outgoing value receiving at its input under control of said one output clock signal; a timing unit having a control input, means for generating a first plurality and a second plurality of pulses for stepping the approximation logic and comparator means in response to the receipt of a start pulse at said control input, and an output connected to the approximation logic means, the number of stepping pulses in said first and second pluralities being equal to the first and second finite numbers, the period of said stepping pulses being chosen such that the time required to generate sequentially said first and second pluralities and also one of said pluralities again is less than one of the periods of the first and second input clock pulses; controlled gating means connected between said incoming means and outgoing means and said approximation logic and comparator means for establishing connections therebetween to control the type of conversion to be performed, said controlled gating means in response to a first control signal permitting the conversion of an analog signal value received by one of the input means to a digital PCM-word value which is transmitted by one of the output means and in response to a second control signal permitting the conversion of the digital PCM-word value received by the other of the input means to an analog signal value which is transmitted to the other output means; and a control means receiving the first input clock signals for generating the first control signals and start pulses and receiving the second input clock signals for generating the second control signals and start pulses, said control means including means for insuring that only one of the first and second control signals is generated at any one time by delaying, during the generation of one of said control signals, the other control signal until the end of said one of said control signals even if the input clock signal associated with said other is received, and said one of said control signals never being delayed.

15. The apparatus of claim 14 wherein said control means comprises first and second bistable devices which when in a first stable state generate the first and second control signals respectively, means for setting each of said bistable devices to a second stable state at the end of a conversion operation, one of said bistable devices being set to the first stable state in response to the receipt of said other input clock signals, a delay means operative in response to the receipt of one of said other input clock signals to emit a delayed signal delayed by a period of time at least equal to the time required to perform the conversion operation initiated by the setting of said one bistable device to the first stable state, a notification means activated by said one input clock signal, and means for setting the other bistable device to the first stable state after said notification means is activated and said delayed signal is emitted.

16. In a codec having a first input means for receiving incoming analog signal values and being periodically sampled by a first input clock signal having a first frequency and a first period, a second input means for receiving incoming digital PCM-word values and being periodically sampled by a second input clock signal having a second frequency and a second period, the first and second input clock signals having approximately equal periods, but being in a plesiochronous relationship, a first output means adapted to transmit analog signal values, a second output means adapted to transmit digital PCM-word values, a common periodically stepped approximation logic and comparator means which for each step generates a digital PCM-word value at a digital output and an analog signal value at an analog output functionally related to the digital PCM-word value, there being a first finite number of steps through which the approximation logic and comparator means can be stepped for an analog signal to digital PCM-word conversion and second finite number of steps through which the approximation logic and comparator means can be stepped for a digital PCM-word to analog signal conversion, apparatus for controlling the codec to perform a first conversion of an analog signal value to a digital signal value and also a second conversion of a digital PCM-word value to an analog signal value with the common periodically stepped logic and comparator means, said apparatus comprising:

a source of the first input clock signals and first output clock signals in synchronism therewith; a source of the second input clock signals and second output clock signals in synchronism therewith; a first memory means in one of the input means, said first memory means having an input receiving one of the incoming values, a control input for receiving one of the input clock signals and an output for transmitting a value resulting from the sampling of the incoming value by said one clock signal; a second memory means in one of the output means, said second memory means having an input for receiving an outgoing value, a control input for receiving one of the output clock signals, and an output for transmitting the outgoing value received at its input under control of said one output clock signal; a timing unit having a control input, means for generating a first plurality and a second plurality of pulses for stepping the approximation logic and comparator means in response to a start pulse, and an output connected to the approximation logic means, the number of stepping pulses in said first and second pluralities being equal to the first and second finite numbers, the period of said stepping pulses being chosen such that the time required to generate sequentially said first and second pluralities is less than the period between the shorter of the periods of the first and second input clock pulses; controlled gating means connected between said incoming means and outgoing means and said approximation logic and comparator means for establishing connections therebetween to control the type of conversion to be performed, said controlled gating means in response to a first control signal permitting the conversion of an analog signal value received at one of the input means to a digital PCM-word value which is transmitted by one of the output means and in response to a second control signal permitting the conversion of the digital PCM-word value received by the other input means to an analog signal value which is transmitted by the other output means; intermediate memory means for storing intermediate values generated by the approximation logic and comparator means; and a control means comprising a first and second bistable devices which when in a first stable state generate the first and second control signals, respectively, means for setting each of said bistable devices to a second stable state at the end of a conversion operation, one of said bistable devices being set to the first stable state in response to the receipt of said other input clock signal, means for setting the other bistable device to the first stable state in response to the receipt of said one input clock signal when said one bistable device is not in the first stable state, and interrupt means responsive to the setting of said one bistable device to the first stable state to switch said other bistable device from the first stable state to the second stable state, said interrupt means including means for controlling for storage of the values generated by said approximation logic and comparator means in said intermediate memory, and means responsive to the setting of said one bistable device from the first stable state to the second stable state for resetting said other bistable device to the first stable state and for controlling the transfer of the values stored in said intermediate storage means to said approximation logic and comparator means; and said control means including means for generating the start pulses.

17. In a codec having a first input means for receiving analog signals and being periodically sampled by a first clock signal having a first frequency and a first period, a second input means for receiving digital PCM-words and being periodically sampled by a second clock signal having a second frequency and a second period, the first and second clock signals having approximately equal periods but being in a plesiochronous relationship, a first output means adapted to transmit analog signals, a second output means adapted to transmit digital PCM-words, an analog signal comparator means having two comparing inputs and a result output, a digital to analog converter means for converting a digital word to analog signal amplitude and having a digital word input means and an analog signal output, means for connecting one fo the comparing inputs to the analog signal output and the other of the comparing inputs to the first input means, stepped digital word generating means for sequentially generating a set of digital words having a control input and a digital word output, there being a first finite number of steps through which the stepped digital word generating means can be stepped for an analog signal to digital PCM-word conversion and there being a given time interval for a digital PCM-word to analog signal conversion, the method of controlling the codec to perform a first conversion of an analog signal to a digital PCM-word and also a second conversion of a digital PCM-word to an analog signal with the commonly used digital to analog converter means, said method comprising the steps of selecting the period of each step of the stepped digital word generating means such that the time required to perform the first number of finite steps as well as the given time interval is no longer than the shorter of said first and second periods whereby a first and a second conversion can be performed in a length of time which is no greater than said shorter period, storing in the second input means received digital PCM-words, initiating a first conversion, in response to a first clock signal sampling the analog stored in the first input means, said first conversion being performed by connecting the result output of the analog signal comparator means to the control input of the stepped digital word generating means to control the stepping thereof and connecting the digital word output of the digital word generating means to the digital word input means of the digital to analog converter means, storing the results of such first conversion in the first output means, initiating a second conversion in response to a second clock signal sampling the digital PCM-word stored in the second input means, said second conversion being performed by connecting the second input means to the digital word input means of the digital to analog converter means, transferring the results of such second conversion to the second output means, and insuring that only one of said first or second conversions can occur at any one time.

18. The method of claim 17 wherein said insuring step comprises delaying the start of one of said conversions until the completion of the other of said conversions if in said other conversion is in progress.

19. The method of claim 18 further comprising the step of selecting a particular one of said conversions to be performed if both conversions are to be initiated simultaneously in response to the simultaneous samplings by the first and second clock signals.

20. The method of claim 17 wherein said insuring step comprises interrupting the processing of one of said conversions if the other of said is called for processing said other conversion and thereafter completing the interrupted processing.

21. In a codec having a first input means for receiving analog signals and being periodically sampled by a first clock signal having a first frequency and a first period, a second input means for receiving digital PCM-words and being periodically sampled by a second clock signal having a second frequency and a second period, the first and second clock signals having approximately equal periods but being in a plesiochronous relationship, a first output means adapted to transmit analog signals, a second output means adapted to transmit digital PCM-words, an analog signal comparator means having two comparing inputs and a result output, a digital to analog converter means for converting a digital word to analog signal amplitude and having a digital word input means and an analog signal output, apparatus for controlling the codec to perform a first conversion of an analog signal to a digital PCM-word and also a second conversion of a digital PCM-word to an analog signal with the commonly used digital to analog converter means and analog signal comparator means, said apparatus comprising:

stepped digital word generating means for sequentially generating a set of digital words having a stepping pulse input, a control input and a digital word output, there being a first finite number of steps through which the stepped digital word generating means can be stepped for an analog signal to digital PCM-word conversion and there being a given time interval for a digital PCM-word to analog signal conversion; a source of the first input clock signals and first output clock signals in synchronism therewith; a source of the second input clock signals; an analog signal memory means in the first input means, said analog signal memory means having an input for receiving the incoming analog signals, a control input for receiving the first input clock signals and an output for transmitting to one comparing input of the analog signal comparator means an analog signal amplitude resulting from the sampling of the incoming analog signal by a first clock signal; an analog signal receiving means in the first output means, said analog receiving means having an input for receiving an outgoing analog signal received at its input under control of the first gating control signal; a digital PCM-word receiving means in the second input means, said digital PCM-word receiving means having an input for receiving the incoming digital PCM-words, a control input for receiving the second input clock signals and an output for transmitting the digital PCM-word being received in response to the receipt of a second input clock signal; a first digital PCM-word memory means having an input for receiving an outgoing digital PCM-word, a control input for receiving the first output clock signals and an output for transmitting an outgoing digital PCM-word received at its input under control of a first output clock signal; a timing means for generating the clock signals and including further means for generating a first plurality of stepping pulses fed to the stepping pulse input of said digital word generating means in response to the occurrence of each of the first input clock signals, the number of stepping pulses in said plurality being at least equal to said first finite number, the period of said stepping pulses being chosen such that the time required to generate said first plurality of stepping pulses plus said given time interval is less than the period between the shorter of the periods of the first and second input clock signals; controlled gating means for alternately permitting either, in response to the absence of a first control signal, the first conversion of an analog signal stored in said analog signal memory means to a digital PCM-word which is then stored in said first digital PCM-word memory means by interconnecting the analog output of the digital to analog converter means, the other comparison input and the result output of the analog signal comparator means and the control input of said stepped digital word generating means as well as connecting the digital word output of said stepped digital word generating means to the digital word input means of said digital to analog converter means and to the input of said first digital PCM-word memory means, or permitting, in response to the presence of the first control signal, the second conversion of the digit PCM-word in the digital PCM-word receiving means to an analog signal which is emitted from the first output means by connecting said digital PCM-word receiving means via said digital to analog converter means to said analog signal receiving means in the first output means; and a control means receiving the first and second input clock signals for generating the first control signals, said control means including supervisory means for controlling when the first control signals are generated with respect to the occurrence of the first and second input clock signals.

22. The apparatus of claim 21 wherein said supervisory means includes means, in response to the receipt of a second input clock signal for generating a first control signal whereby a first conversion in progress is interrupted and a second conversion performed and said supervisory means including further means for thereafter transmitting a restep pulse to said digital word generating means whereby said digital word generating means repeats the generation of the digital word present when said first control signal was generated.

* * * * *